United States Patent
Wong

(10) Patent No.: US 6,288,581 B1
(45) Date of Patent: Sep. 11, 2001

(54) LOW-VOLTAGE DIFFERENTIAL-SIGNALLING OUTPUT BUFFER WITH PRE-EMPHASIS

(75) Inventor: Anthony Yap Wong, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/681,101

(22) Filed: Jan. 5, 2001

(51) Int. Cl.[7] .............................. H03F 3/45; H03K 3/00
(52) U.S. Cl. .................................. 327/108; 327/321
(58) Field of Search ........................ 327/108, 109, 327/112, 562, 563, 309, 319, 321, 328, 387, 391; 326/83

(56) References Cited

U.S. PATENT DOCUMENTS

| | | |
|---|---|---|
| 5,144,297 | 9/1992 | Ohara ............................ 340/825.79 |
| 5,519,728 | 5/1996 | Kuo ...................................... 375/257 |
| 5,625,320 | 4/1997 | Hagerty ................................. 330/2 |
| 5,659,260 * | 8/1997 | Kajimoto et al. ...................... 327/55 |
| 5,684,429 | 11/1997 | Sanwo et al. ........................ 327/563 |
| 5,694,060 | 12/1997 | Brunt et al. .......................... 326/86 |
| 5,761,244 | 6/1998 | Hedberg ............................... 375/257 |
| 5,856,757 * | 1/1999 | Eschauzier .......................... 327/553 |
| 5,874,837 | 2/1999 | Manohar et al. ...................... 326/83 |
| 5,917,340 | 6/1999 | Manohar et al. ...................... 326/82 |
| 5,959,472 | 9/1999 | Nagamatsu et al. ................. 327/108 |
| 5,977,796 | 11/1999 | Gabara ................................. 326/86 |
| 5,986,479 | 11/1999 | Mohan ................................ 326/115 |
| 6,049,229 | 4/2000 | Manohar et al. ..................... 326/83 |
| 6,051,990 | 4/2000 | Uber ................................... 326/33 |
| 6,111,431 | 8/2000 | Estrada ............................... 326/83 |
| 6,246,270 * | 6/2001 | Wang et al. ........................ 327/111 |

* cited by examiner

Primary Examiner—My-Trang Nu Ton
(74) Attorney, Agent, or Firm—Stuart T. Auvinen

(57) ABSTRACT

A low-voltage differential signaling (LVDS) output buffer has an improved eye pattern. The LVDS buffer has two parallel stages. A primary stage generates enough current to generate a first voltage drop across a load resistor. At higher frequencies, parasitic capacitive coupling reduces this first voltage drop, closing the eye pattern. A boost stage generates an additional boost current through the load resistor, adding to the voltage drop and opening the eye pattern. The boost stage is coupled to the outputs by link transistors that are enabled by a pre-emphasis signal generated by resetable pulse generators. When outputs switch, the pre-emphasis signal pulses the link transistors on, adding the boost current. At high frequencies, the pulse generators are reset before the pre-emphasis signal ends. The boost current is continuously added at high frequencies, but at low frequencies the boost current only occurs during the pre-emphasis period after outputs switch.

20 Claims, 6 Drawing Sheets

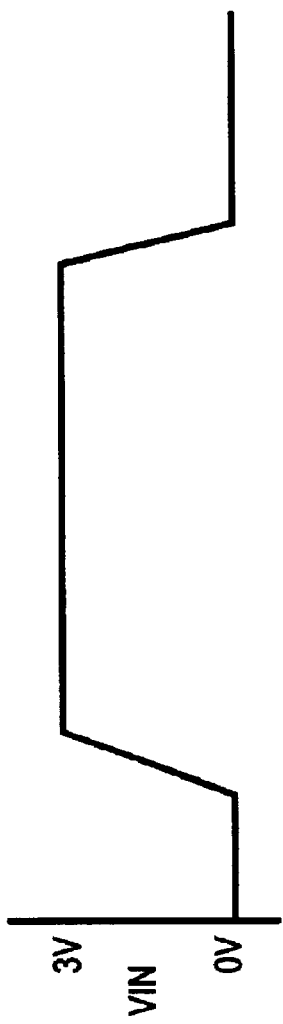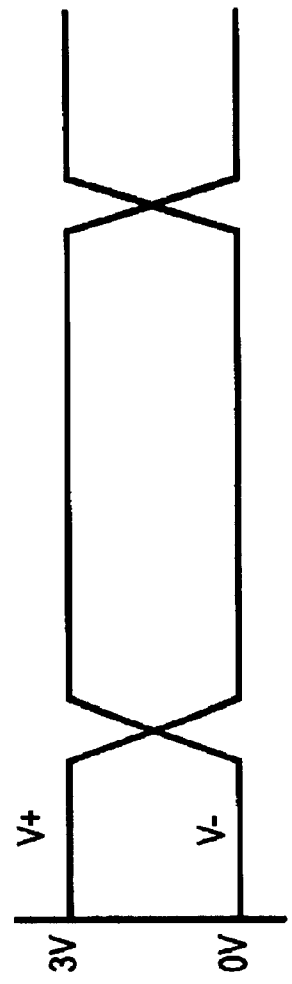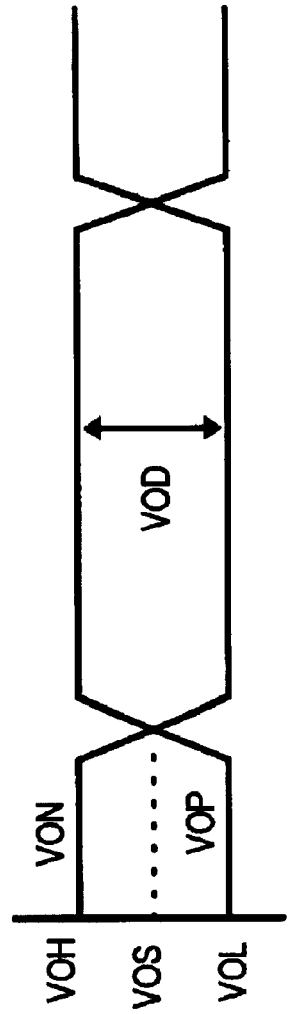

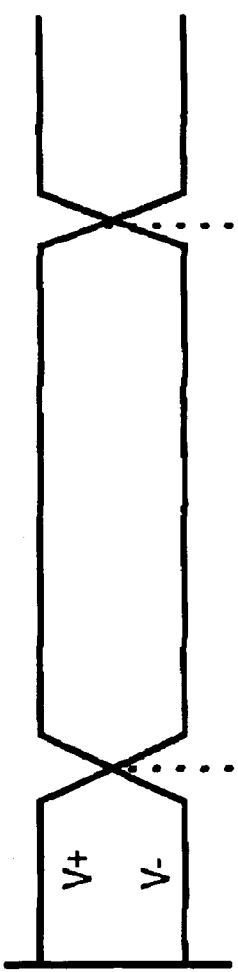
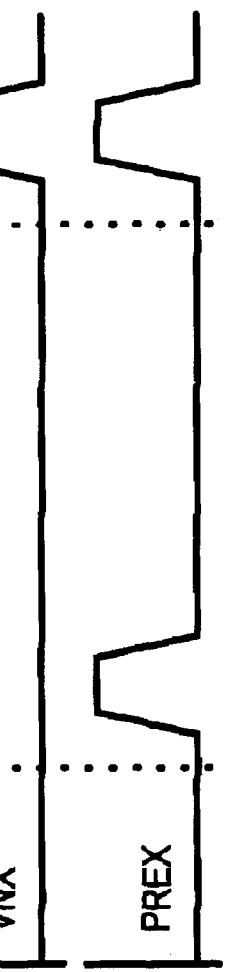
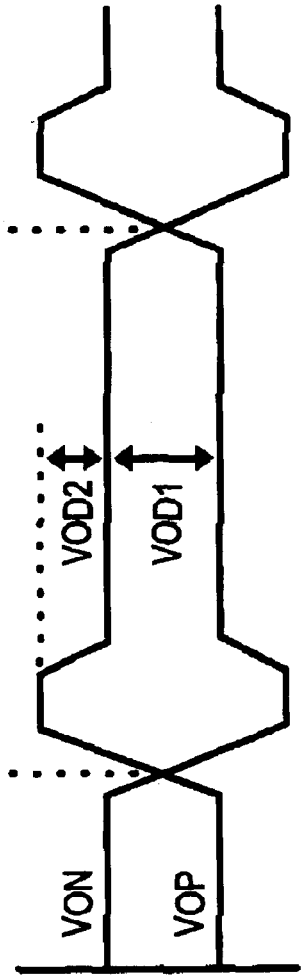
FIG. 5A
FIG. 5B
FIG. 5C
FIG. 5D
FIG. 5E

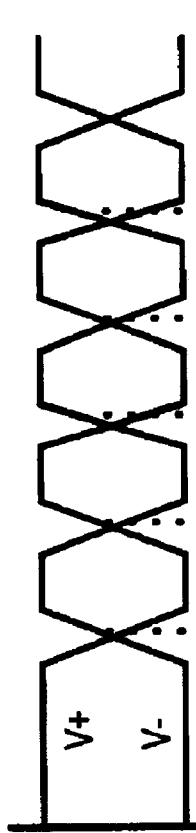
FIG. 6A
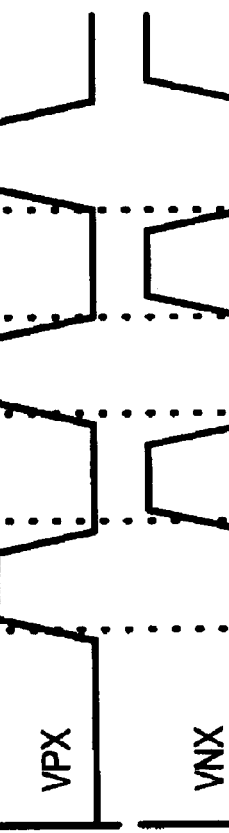
FIG. 6B
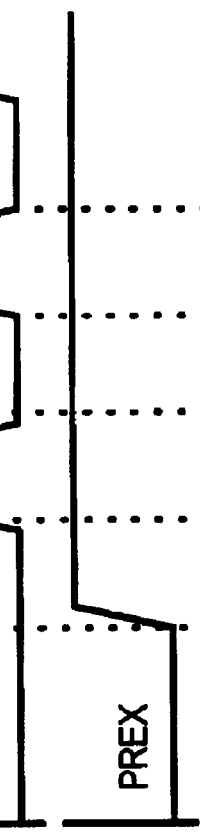
FIG. 6C
FIG. 6D
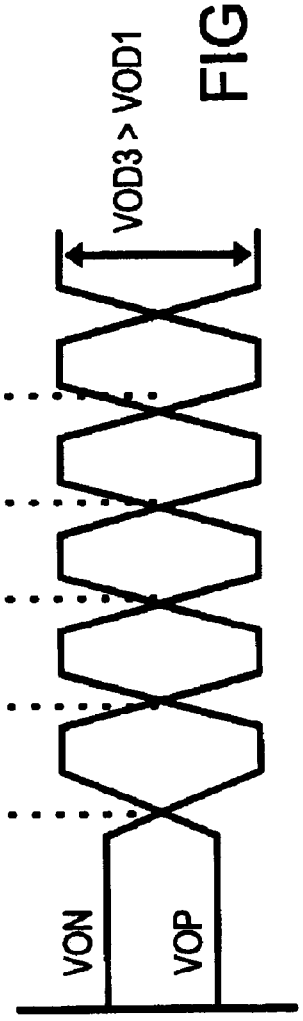
FIG. 6E

LOW-VOLTAGE DIFFERENTIAL-SIGNALLING OUTPUT BUFFER WITH PRE-EMPHASIS

BACKGROUND OF INVENTION

This invention relates to CMOS output buffers, and more particularly to low-voltage differential-signaling output buffers.

A variety of electronic systems rely on improvements in high-speed signaling to increase performance. Networks can operate at higher data rates when signals are propagated more quickly between stations and within network switches. Computers process data at a higher rate when the data can be sent to memory and peripherals at higher speeds. Telephone systems can handle more calls when faster transmission occurs.

One of the bottlenecks to improved performance is external signaling, when signals are driven from an integrated circuit (IC) to another IC. Metal traces on a printed-circuit board (PCB) must be driven by the IC's output buffer. These metal traces are much larger than the metal lines on the IC itself and thus have a higher capacitive and resistive load. Some signals need to be drive off the PCB across cabling, perhaps to other rooms or buildings. An even higher drive is then needed.

Traditionally the IC's output buffers drove signals fully to the power rails—Vcc (or Vdd) and ground. CMOS-level or Transistor-Transistor-Level (TTL) signals were driven from ground to 5 volts or 3 volts and back when transitions occurred. While such TTL or full-level signals are useful to provide wide noise margins, large external loads cannot quickly be driven with such wide voltage swings without creating electro-magnetic interference (EMI) and distortions. Driving low impedance transmission lines has long been a problem.

While full-swing signaling is still used internally in IC's, more recently off-chip signaling has employed limited-voltage swings. Rather than swing the output a full 5 volts, the outputs swing only 350 milli-volts (mV) or so. Two output signals per bit of information are used, rather than just one output. The two outputs are driven to opposite states, in what is known as differential signaling. When one output swings up 350 mV, the other swings down 350 mV. The two differential signals can be connected together by a resistor at the far end of the cable to produce a voltage difference when current-switching output drivers are used.

Such low-voltage differential signaling (LVDS) techniques can speed data rates and reduce EMI, even when long cables are driven.

BRIEF DESCRIPTION OF DRAWINGS

FIGS. 2A–C are waveforms illustrating operation of the LVDS buffer of FIG. 1.

FIGS. 5A–E are waveforms highlighting operation of the LVDS buffer of FIG. 3 at lower frequencies with pre-emphasis.

FIGS. 6A–E are waveforms highlighting operation of the LVDS buffer of FIG. 3 at high frequencies.

DETAILED DESCRIPTION

The present invention relates to an improvement in low-voltage differential signaling (LVDS) drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
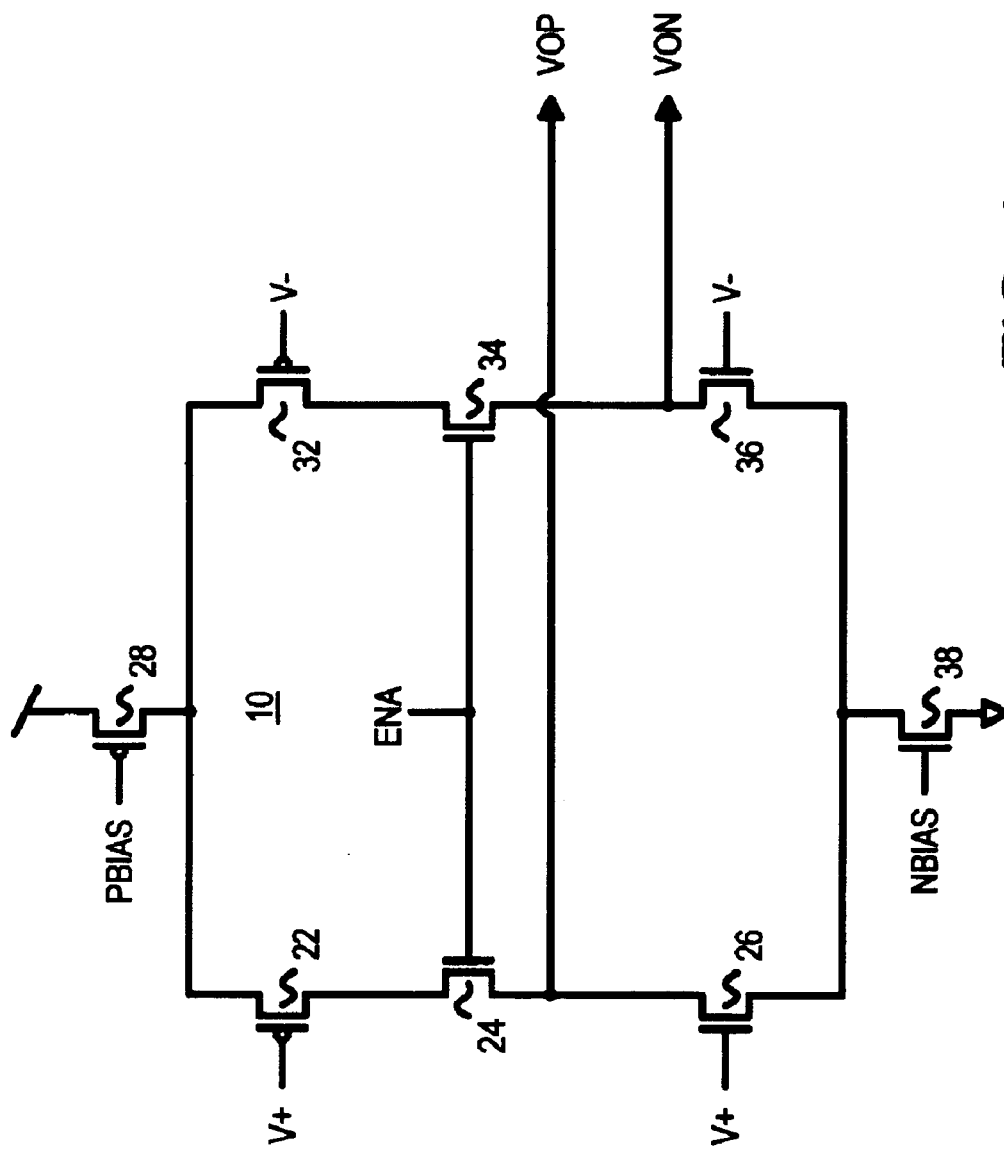
FIG. 1 is a schematic diagram of a basic low-voltage differential signaling (LVDS) output buffer.

FIG. 1 is a schematic diagram of a basic low-voltage differential signaling (LVDS) output buffer. Current-steering buffer 10 receives differential inputs V+, V− and generates differential outputs VOP, VON. Input V+ is applied to the gates of p-channel transistor 22 and n-channel transistor 26, while input V− is applied to the gates of p-channel transistor 32 and n-channel transistor 36.

When V+ rises and V− falls in voltage, transistors 26, 32 are turned on to conduct current drive while transistors 22, 36 are turned off to stop current drive. This pulls the voltage of VOP lower, and VON higher. Buffer 10 thus inverts the states of V+, V− to generate VOP, VON.

Enable n-channel transistors 24, 34 are normally enabled by enable signal ENA being in a high state. Enable transistors 24, 34 serve to limit the leakage current from outputs VOP, VON to Vdd.

Current-source p-channel transistor 28 acts as a current source controlled by its gate bias, PBIAS. Bias PBIAS can be adjusted for temperature, Vcc, and process variations using a bias generator circuit, thus adjusting the current sourced by transistor 28. In one embodiment, current-source transistor 28 sources 3.5 milli-amps (mA). Likewise, current-sink n-channel transistor 38 is controlled by its gate bias, NBIAS, and sinks about 3.5 mA in one embodiment.

When full-swing voltages are input for V+, V−, the full 3.5 mA of current is switched to either VOP or VON. For example, when Vcc is 3.3 volts, and V+ is driven high to 3.3 volts while V− is driven low to ground, n-channel transistor 36 and p-channel transistor 22 turn off, while n-channel transistor 26 and p-channel transistor 32 are on strongly. All the current from current-source p-channel transistor 28 flows through p-channel transistor 32 to output VON, while n-channel transistor 26 sinks current from VOP through current-sink n-channel transistor 38.

An external load resistor (not shown) is typically connected between VOP, VON at the far end of a cable driven by buffer 10. This load resistor produces a voltage between VOP, VON. As buffer 10 switches current among VOP, VON, the voltage on the load resistor varies and can be sensed by a differential sense amplifier or input on a receiver.

For example, a 100-ohm load resistor generates a 0.35-volt IR drop when 3.5 mA of current flows from VON to VOP.

FIGS. 2A–C are waveforms illustrating operation of the LVDS buffer of FIG. 1. In FIG. 2A, an upstream input VIN switches from low-to-high and later back from high-to-low. This input VIN is converted to differential input signal V+, V− by standard logic such as an odd number of inverters to generate V+, and an even number of inverters to generate V−. These are full-swing differential inputs, as shown in FIG. 2B.

FIG. 2C shows the differential outputs VOP, VON produced by buffer 10 of FIG. 1, when the differential inputs V+, V− of FIG. 2B are applied. The vertical (voltage) scale is enlarged in FIG. 2C, since VOH and VOL typically differ by only a few hundred mV, such as 350 mV (0.35 volt).

When differential inputs V+, V− switch, current is switched among the VOP, VON outputs, causing a switching of outputs VOP, VON around the common-mode voltage VOS. The voltage difference, VOD, generated across the load resistor is the resistance multiplied by the current switched, I*R. For a 100-ohm resistor and a 3.5-mA current, VOD is 350 mV.

EYE PATTERN CLOSES AT HIGH FREQUENCIES

The switching waveforms of FIG. 2C is known as an eye pattern, since the opening between VOP and VON has an appearance similar to the shape of a human eye. The height of the eye opening is voltage difference VOD. When an actual circuit that drives a real cable is viewed using an oscilloscope or test analyzer, the waveforms of many cycles are superimposed on one another. The lines for VOP and VON then often appear fuzzy with a larger thickness. Distortions can occur, further reducing the opening of the eye pattern due to jitter and noise of the cable environment.

At very high frequencies, such as about 0.5-GigaHz, the height of the eye (VOD) can decrease significantly. When VOP is driven high at these high frequencies, it is kept lower in voltage than at low frequencies due to a parasitic capacitance. Coupling between V+ and VOP occurs across the drain-to-gate parasitic capacitance of n-channel transistor 26. As V+ falls in voltage, the rise in VOP is reduced by capacitive coupling across this parasitic gate-to-drain and drain to ground capacitor. More output current to VOP is robbed by this parasitic capacitor as higher frequencies are used. At extremely high frequencies the parasitic capacitor shorts the switching current, closing the eye completely. This limits operation at higher frequencies.

PRE-EMPHASIS IMPROVES EYE PATTERN

The eye pattern can be improved by using a pre-emphasis technique. When the output is first switched, a boosted current is used to initially increase the voltage difference. Then the current boost ends, and the voltage difference decreased to the normal value. The height of the eye is thus increased at the beginning (left side) of the eye when pre-emphasis is added.

The increased voltage difference at the beginning of the eye pattern can improve performance, since any distortions can be compensated by the larger voltage difference. At high frequencies when the parasitic capacitance reduces the voltage difference, pre-emphasis compensates by increasing the voltage difference.

CURRENT-BOOST STAGE ADDS PRE-EMPHASIS—FIG. 3

Figure 3:
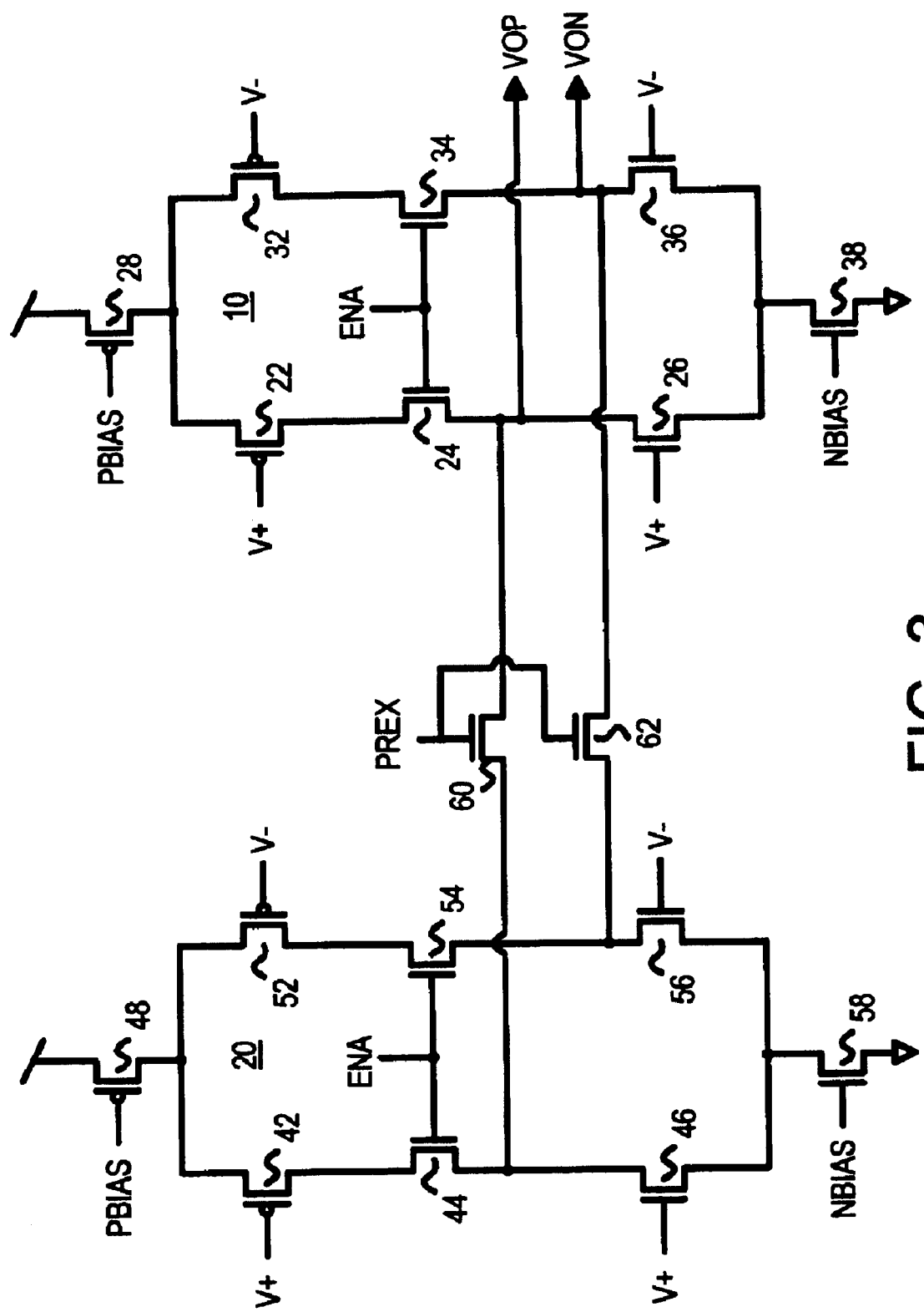
FIG. 3 is a schematic of a LVDS output buffer with a current-boost stage for pre-emphasis.

FIG. 3 is a schematic of a LVDS output buffer with a current-boost stage for pre-emphasis. Primary buffer 10 steers current to outputs VOP, VON using transistors 22, 26 that receive V+, and transistors 32, 36 that receive V−. The current produced by current-source p-channel transistor 28 and current-sink n-channel transistor 38 is about 3.5 mA.

Boost stage 20 is similar to primary buffer 10, except that a smaller current is switched. Current-source p-channel transistor 48 and current-sink n-channel transistor 58 source only about 1.0 mA, compared with the 3.5 mA switched by buffer 10. Current is switched in a similar manner, with input V+ applied to the gates of p-channel transistor 42 and n-channel transistor 46, while V− is applied to the gates of p-channel transistor 52 and n-channel transistor 56.

Enable signal ENA is kept high when output signals VOP, VON are driven, so nchannel transistors 44, 54 in boost stage 20 remain on, as do n-channel transistors 24, 34 in primary-stage buffer 10.

N-channel link transistors 60, 62 connect the outputs of the two stages 10, 20. Link transistor 60 allows the current from boost stage 20 to flow to output VOP, while link transistor 62 allows the current from boost stage 20 to flow to output VON. Primary stage buffer 10 is always connected to outputs VOP, VON, while boost stage 20 is connected only when link transistors 60, 62 are enabled.

The gates of link transistors 60, 62 are driven by boost signal PREX. When boost signal PREX is high, the current from boost stage 20 is added to the current from primary-stage buffer 10, increasing the output current. When boost signal PREX is low, only primary-stage buffer 10 drives the outputs. Thus boost signal PREX increases the output current by coupling the current being switched by boost stage 20 to the VOP, VON outputs.

Boost signal PREX is timed to increase current during and immediately after switching, but to return to normal current levels after a time delay. This timing provides a pre-emphasis period, when boost signal PREX is active. During the pre-emphasis period, current is increased, since boost stage 20 is coupled to switch additional current to outputs VOP, VON.

During the pre-emphasis period, the total current switched is 4.5 mA, 3 mA from primary-stage buffer 10, and 1 mA from boost stage 20. For a 100-ohm load resistor, the voltage difference VOD across the load resistor is 4.5 mA*100 ohm, or 450 mV. Once pre-emphasis ends, the current drops to the 3 mA current from the primary-stage buffer 10. The voltage difference then drops to 350 mV. Thus in this example, a pre-emphasis voltage boost of 100 mV is provided by boost stage 20.

Boost stage 20 does not draw current when link transistors 60, 62 are off, since it has no load. Thus power is reduced after pre-emphasis ends. At very high operating frequencies, the switching period can be smaller than the pre-emphasis period. Then pre-emphasis remains on for the entire duration of the eye pattern. The voltage difference is thus increased for high switching frequencies.

PRE-EMPHASIS TIMING GENERATOR—FIG. 4

Figure 4:
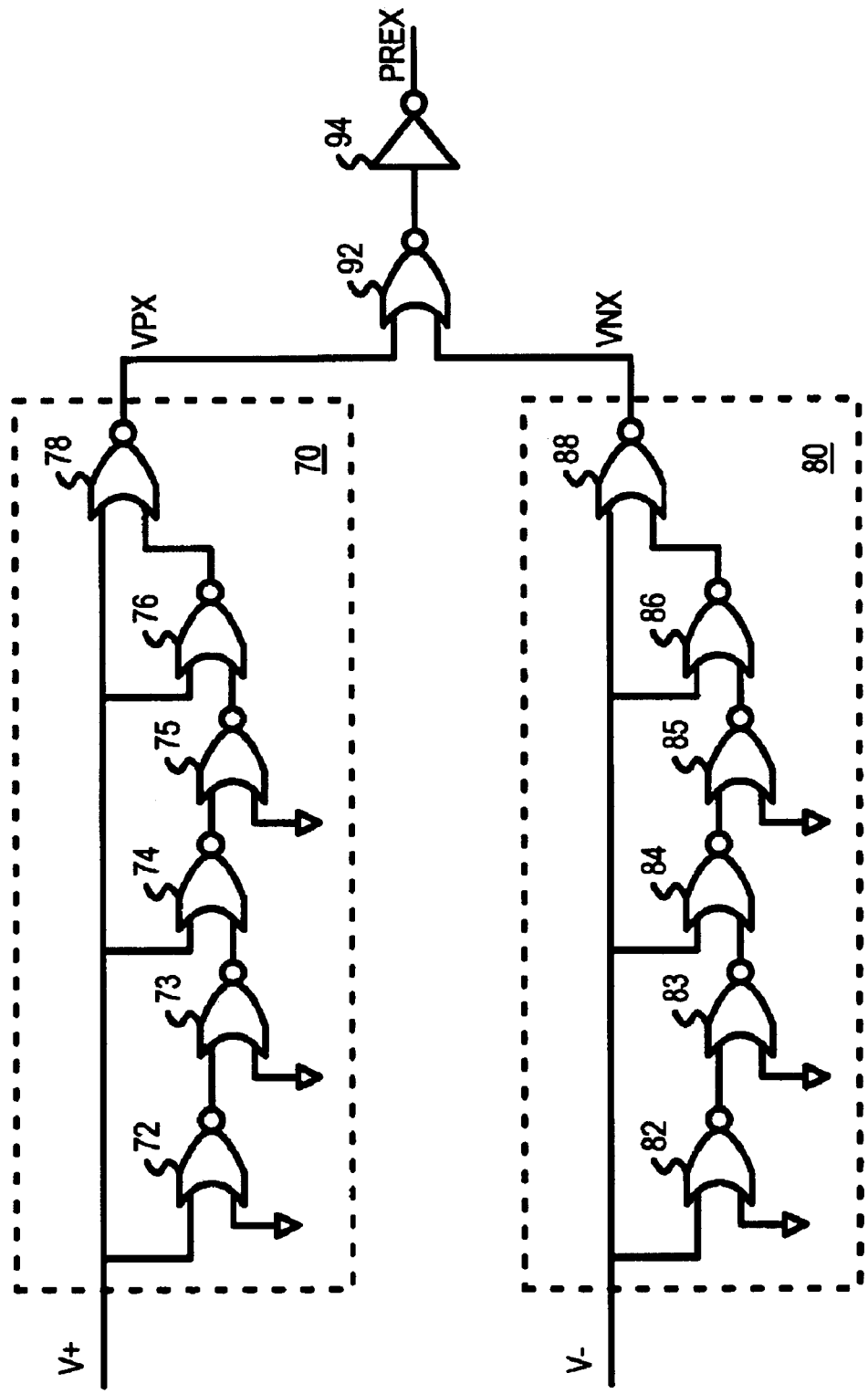
FIG. 4 is a diagram of a pre-emphasis timing generator for the boost signal that links the boost stage to the output during the pre-emphasis period.

FIG. 4 is a diagram of a pre-emphasis timing generator for the boost signal that links the boost stage to the output during the pre-emphasis period. Two resetable pulse generators are used. Pulse generator 70 generates a positive pulse VPX when input V+ transitions from high-to-low. Pulse generator 80 generates a positive pulse VNX when input V− transitions from high-to-low.

When either V+ or V− transitions low, the high-going pulse VPX or VNX generates a high-going pulse on boost signal PREX through NOR gate 92 and inverter 94. The pre-emphasis period occurs when boost signal PREX is high, since link transistors 60, 62 couple the boost current from boost stage 20 to the VOP, VON outputs in response to a high boost signal PREX.

Pulse generator 70 is initially in a reset state when V+ is high. The outputs of NOR gates 72, 74, 76 are forced low by the high V+. VPX is low, since one of the two inputs to NOR gate 78 is high.

When V+ transitions low, the VPX pulse begins as the low V+ first reaches the upper input to NOR gate 78. The lower input to NOR gate 78 is already low, since it is also the output of NOR gate 76, which earlier had a high on its V+ input.

Although the upper input to NOR gate 76 goes low, its lower input is still high. Thus it still outputs a low to the lower input of NOR gate 78. The VPX pulse from NOR gate 78 does not end until the low V+ propagates through NOR gates 72, 73, 74, 75, 76. The propagation delay through NOR gates 72–76 sets the width of the VPX pulse.

At very high frequencies, V+ can transition high before the VPX pulse ends. Pulse generator 70 is reset by V+ going high, even before the earlier low transition has propagated all the way through the string of NOR gates 72–76. The transition of V+ back to high is immediately input to the upper inputs of NOR gates 72, 74, 76. The outputs of NOR gates 72, 74, 76 are all forced low at the same time. Once this forced low propagates through NOR gates 73, 75, the pulse generator is reset and ready for re-triggering by the next low-transition of V+. The VPX pulse itself is immediately cut off by V+ high through NOR gate 78.

NOR gates 82–86, 88 in pulse generator 80 operate in the same manner with respect to V− generating VNX, as described for pulse generator 70. Both pulse generators 70, 80 are quickly reset when its input transitions prematurely, as occurs at very high frequencies.

FIGS. 5A–E are waveforms highlighting operation of the LVDS buffer of FIG. 3 at lower frequencies with pre-emphasis. When input V+ transitions low in FIG. 5A, pulse VPX is generated in FIG. 5B. Likewise, when input V− transitions low in FIG. 5A, pulse VNX is generated in FIG. 5C. In FIG. 5D, boost signal PREX is generated when either pulse VPX or VNX is generated.

FIG. 5E shows the outputs VOP, VON on an enlarged vertical scale. When V+, V− switch, VOP and VON also switch. Since the boost signal PREX is turned on immediately after the transition, the linking transistors couple the current from boost stage 20 to the output, which also receives the current from the primary stage buffer. Thus the current through the load resistor is boosted while PREX is high.

Once boost signal PREX ends, the linking transistors isolate the boost stage from the VOP, VON outputs. The current through the load resistor is reduced to that of the current from the primary stage buffer. The lowered IR drop through the load resistor produces a smaller voltage difference VODi than the larger voltage difference VOD1+2*VOD2 produced during the pre-emphasis period.

In the example used earlier of a 100-ohm load resistor, and 3.5-mA primary current and 1-mA boost current, VOD1 is 350 mV while 2*VOD2 is 100 mV. During the pre-emphasis period, the voltage difference is increased to 450 mV from the nominal 350 mV. Noise immunity during the pre-emphasis period is improved due to the wider initial eye pattern.

FIGS. 6A–E are waveforms highlighting operation of the LVDS buffer of FIG. 3 at high frequencies. When input V+ transitions low in FIG. 6A, pulse VPX is generated in FIG. 6B. Likewise, when input V− transitions low in FIG. 6A, pulse VNX is generated in FIG. 6C.

The VPX and VNX pulses are reset by the next transitions of V+, V−, since these transitions occur before the pre-emphasis period otherwise ends due to the propagation delay through the string of NOR gates in the pulse generators. Thus the VPX and VNX pulses occupy the entire half-period of the inputs. In FIG. 6D, the boost signal PREX remains on throughout many transitions, since VPX and VNX are continuously being re-generated.

FIG. 6E shows the outputs VOP, VON on an enlarged vertical scale. When V+, V− switch, VOP and VON also switch. Since the boost signal PREX is turned on continuously for many transitions, the linking transistors remain on and do not turn off. They couple the current from boost stage 20 to the output, which also receives the current from the primary stage buffer. Thus the current through the load resistor is boosted for many cycles while PREX remains high.

Although current is boosted by the boost stage remaining coupled to the outputs for many cycles, the current is reduced by the parasitic gate-to-drain and drain-to-ground capacitance in each stage. Thus the ideal voltage difference, 2*VOD2+VOD1, is not obtained at high frequencies due to this parasitic effect. Instead, and intermediate voltage difference, VOD3, is obtained. This VOD3 is still larger than the voltage difference that would be obtained if only the primary stage were driving current to the load resistor, since the current from the boost stage is ordinarily much greater than the current robbed by the parasitic capacitive coupling.

ALTERNATE EMBODIMENTS

Several other embodiments are contemplated by the inventor. For example, full transmission gates can be substituted for the n-channel link transistors. Different transistor sizes and biases can be used to obtain desired currents in the two stages. The load resistance may be chosen by the system designer from a range of values. Additional devices such as capacitors can be added, and various parasitic resistances and capacitances may exist but are not shown. The pulse generator can be constructed in many variations, such as using NAND gates and signal inversion rather than NOR gates as shown. Positive logic gates may be used, such as an OR gate constructed from a NOR gate and an inverter as is commonly available from standard-cell libraries. More complex multi-input gates can also be employed.

Additional boost or primary stages may be included. Separate timing signals may be used to provide a gradual increase or decrease in switching currents. The voltage differences (VOD) shown are actually absolute values since current can flow in either of two directions. Of course, any advantages and benefits described may not apply to all embodiments of the invention.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line. The terms source and drain when used for transistors can often be interchanged, depending on the direction of current flow.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A low-voltage differential signaling (LVDS) buffer comprising:
   a differential pair of outputs for driving a current through a load resistor;
   a primary stage for switching a primary current among the differential pair of outputs in response to a differential pair of inputs;
   a pair of link transistors having control gates coupled to a boost signal, for conducting a boost current to the differential pair of outputs when the boost signal is active, but for isolating the boost current from the differential pair of outputs when the boost signal is not active;
   a boost stage for switching the boost current among the differential pair of outputs in response to the differential pair of inputs; and
   a pulse generator, responsive to the differential pair of inputs, for activating the boost signal in response to switching of the differential pair of inputs, whereby the boost current and the primary current flow through the load resistor when the boost signal is activated by the pulse generator when switching occurs, but only the primary current flows through the load resistor when the boost signal is inactive.

2. The LVDS buffer of claim 1 wherein the pulse generator is reset by further switching of the differential pair of inputs, the pulse generator keeping the boost signal continuously active when the switching of the differential pair of inputs is at a high frequency, but the pulse generator pulsing the boost signal active for a pre-emphasis period that is less than a period of the switching of the differential pair of inputs when switching is at a low frequency.

3. The LVDS buffer of claim 2 wherein the pulse generator further comprises:
   a first pulser, receiving a first input of the differential pair of inputs, for generating a first pulse in response to a transition of the first input;
   a second pulser, receiving a second input of the differential pair of inputs, for generating a second pulse in response to a transition of the second input;
   a combining gate, receiving the first pulse and the second pulse, for activating the boost signal when either the first pulse or the second pulse is activated.

4. The LVDS buffer of claim 3 wherein the first pulser comprises:
   a first chain of logic gates including a first gate receiving the first input, an intermediate gate receiving the first input and a propagated input that is propagated from the first gate, and a final gate receiving the first input and an intermediate propagated input that is propagated from the intermediate gate;
   a pulsing gate, receiving the first input and an output from the final gate, for generating the first pulse;
   wherein the second pulser comprises:
      a second chain of logic gates including an initial gate receiving the second input, a second intermediate gate receiving the second input and a propagated input that is propagated from the initial gate, and a second final gate receiving the second input and an intermediate propagated input that is propagated from the second intermediate gate;
      a second pulsing gate, receiving the second input and an output from the second final gate, for generating the second pulse.

5. The LVDS buffer of claim 4 wherein the first gate, the intermediate gate, the final gate, the pulsing gate, the initial gate, the second intermediate gate, the second final gate, and the second pulsing gate are NOR gates.

6. The LVDS buffer of claim 2 wherein a voltage generated by the current flowing through the load resistor is a boosted voltage during the pre-emphasis period, but a standard voltage when the boost signal is not active;
   wherein the boosted voltage exceeds the standard voltage, whereby a voltage across the load resistor is increased during the pre-emphasis period.

7. The LVDS buffer of claim 6 wherein the link transistors are n-channel transistors having a gate coupled to the boost signal, with sources and drains connected for conducting current between the differential pair of outputs and differential outputs of the boost stage.

8. The LVDS buffer of claim 7 wherein the primary stage comprises:
   a current source for generating the primary current;
   a current sink for sinking the primary current;
   wherein the differential pair of inputs comprises a first input and a second input, and wherein the differential pair of outputs comprises a first output and a second output;
   a first p-channel switching transistor, with a gate coupled to the first input, for switching the primary current from the current source to the first output;
   a first n-channel switching transistor, with a gate coupled to the first input, for switching the primary current from the first output to the current sink;
   a second p-channel switching transistor, with a gate coupled to the second input, for switching the primary current from the current source to the second output; and
   a second n-channel switching transistor, with a gate coupled to the second input, for switching the primary current from the second output to the current sink,
   whereby the primary current is switched to the first or second output.

9. The LVDS buffer of claim 8 wherein the boost stage comprises:
   a current source for generating the boost current;
   a current sink for sinking the boost current;
   a first link output coupled to a drain of a first of the link transistors;
   a second link output coupled to a drain of a second of the link transistors;
   a first p-channel switching transistor, with a gate coupled to the first input, for switching the boost current from the current source to the first link output;
   a first n-channel switching transistor, with a gate coupled to the first input, for switching the boost current from the first link output to the current sink;
   a second p-channel switching transistor, with a gate coupled to the second input, for switching the boost current from the current source to the second link output; and a second n-channel switching transistor, with a gate coupled to the second input, for switching the boost current from the second link output to the current sink, whereby the boost current is switched to the first or second link output.

10. The LVDS buffer of claim 9 wherein the primary stage further comprises:

a first enable transistor, coupled to conduct current between the first p-channel switching transistor and the first n-channel switching transistor, the first enable transistor having a gate coupled to an enable signal;

a second enable transistor, coupled to conduct current between the second p-channel switching transistor and the second n-channel switching transistor, the second enable transistor having a gate coupled to the enable signal;

wherein the boost stage further comprises:

a first enable transistor, coupled to conduct current between the first p-channel switching transistor and the first n-channel switching transistor, the first enable transistor having a gate coupled to the enable signal;

a second enable transistor, coupled to conduct current between the second p-channel switching transistor and the second n-channel switching transistor, the second enable transistor having a gate coupled to the enable signal.

11. The LVDS buffer of claim 10 wherein the first and second enable transistors in the primary stage and in the boost stage are n-channel transistors.

12. The LVDS buffer of claim 11 wherein the current source in the primary stage and in the boost stage is a p-channel transistor with a gate coupled to a p-bias voltage;

wherein the current sink in the primary stage and in the boost stage is an n-channel transistor with a gate coupled to an n-bias voltage.

13. An output buffer comprising:

a first input and a second input that are logical inverses;

a first output and a second output that are differential outputs;

a primary stage comprising:

a current source for generating a primary current;

a current sink for sinking the primary current;

a first p-channel transistor, with a gate coupled to the first input and a source coupled to the current source and a drain coupled to a primary-left node;

a first enable n-channel transistor, with a gate coupled to an enable signal, a drain coupled to the primary-left node, and a source coupled to the first output;

a first n-channel transistor, with a gate coupled to the first input, a drain coupled to the first output, and a source coupled to the current sink;

a second p-channel transistor, with a gate coupled to the second input and a source coupled to the current source and a drain coupled to a primary-right node;

a second enable n-channel transistor, with a gate coupled to the enable signal, a drain coupled to the primary-right node, and a source coupled to the second output;

a second n-channel transistor, with a gate coupled to the second input, a drain coupled to the second output, and a source coupled to the current sink;

a first link transistor, having a gate coupled to a boost signal, a drain coupled to a first link output, and a source coupled to the first output;

a second link transistor, having a gate coupled to the boost signal, a drain coupled to a second link output, and a source coupled to the second output;

a boost stage comprising:

a boost current source for generating a boost current;

a boost current sink for sinking the boost current;

a first p-channel transistor, with a gate coupled to the first input and a source coupled to the boost current source and a drain coupled to a boost-left node;

a first enable n-channel transistor, with a gate coupled to the enable signal, a drain coupled to the boost-left node, and a source coupled to the first link output;

a first n-channel transistor, with a gate coupled to the first input, a drain coupled to the first link output, and a source coupled to the boost current sink;

a second p-channel transistor, with a gate coupled to the second input and a source coupled to the boost current source and a drain coupled to a boost-right node;

a second enable n-channel transistor, with a gate coupled to the enable signal, a drain coupled to the boost-right node, and a source coupled to the second link output;

a second n-channel transistor, with a gate coupled to the second input, a drain coupled to the second link output, and a source coupled to the boost current sink.

14. The output buffer of claim 13 further comprising:

a pulse generator, receiving the first and second inputs, for generating the boost signal, the boost signal being activated in response to first transitions of the first and second inputs.

15. The output buffer of claim 14 wherein the pulse generator is reset by second transitions that are inverses of the first transitions of the first and second inputs.

16. The output buffer of claim 15 wherein the first and second link transistors are n-channel transistors.

17. The output buffer of claim 16 wherein at high frequencies a parasitic capacitance of the first and second n-channel transistors reduces a voltage difference between the first and second outputs;

wherein the boost stage is activated by the boost signal at high frequencies to compensate for parasitic capacitance to increase a voltage difference between the first and second outputs, whereby the boost current compensates for high-frequency loss.

18. A buffer comprising:

a first input and a second input;

a first output and a second output;

a primary stage comprising:

current source means for generating a primary current;

current sink means for sinking the primary current; first upper transistor means for conducting current from the current source means;

first enable transistor means, with a gate coupled to an enable signal, for conducting current from the first upper transistor means to the first output;

first lower transistor means, with a gate coupled to the first input, for conducting current from the first output to the current sink means;

second upper transistor means, with a gate coupled to the second input, for conducting current from the current source means;

second enable transistor means for conducting current from the second upper transistor means to the second output;

second lower transistor means, with a gate coupled to the second input, for conducting current from the second output to the current sink means;

boost stage means, receiving the first and second inputs, for switching a boost current among a first link node and a second link node in response to the first and second inputs;

first link means, responsive to a boost signal, for conducting current between the first link node to the first output; and second link means, responsive to the boost signal, for conducting current between the second link node to the second output, whereby current switched between the first and second outputs is boosted by the boost current in response to the boost signal.

19. The buffer of claim 18 further comprising:

pulse means for generating the boost signal in response to transitions of the first or second inputs, whereby the boost current is switched in response to transitions of the first or second inputs.

20. The buffer of claim 19 wherein the boost stage means further comprises:

boost current source means for generating a boost current;

boost current sink means for sinking the boost current;

first upper transistor means for conducting current from the boost current source means;

first enable transistor means, with a gate coupled to the enable signal, for conducting current from the first upper transistor means to the first link node;

first lower transistor means, with a gate coupled to the first input, for conducting current from the first link node to the boost current sink means;

second upper transistor means, with a gate coupled to the second input, for conducting current from the boost current source means;

second enable transistor means for conducting current from the second upper transistor means to the second link node;

second lower transistor means, with a gate coupled to the second input, for conducting current from the second link node to the boost current sink means.

* * * * *